United States Patent
Tamura et al.

(10) Patent No.: US 10,690,758 B2
(45) Date of Patent: Jun. 23, 2020

(54) STRUCTURE FOR MOUNTING ULTRASONIC SENSOR

(71) Applicants: Honda Access Corp., Niiza-shi, Saitama (JP); Honda Access Taiwan Co., Ltd., Taipei (TW); Whetron Electronics Co., Ltd., New Taipei (TW)

(72) Inventors: Yasuhiro Tamura, Niiza (JP); Ryoichi Enoki, Niiza (JP); Shoji Yokoyama, Niiza (JP); Jun Sugimoto, Niiza (JP); Tatsuya Tachibana, Niiza (JP); Yangjian Li, Niiza (JP); Takuya Tamura, Niiza (JP); Qi Chen, Tokyo (JP); Kai-Wei Yeh, Taipei (TW); Cheng-Hung Tsai, New Taipei (TW); Yu-Ming Lee, New Taipei (TW)

( * ) Notice: Subject to any disclaimer, the term of this patent is extended or adjusted under 35 U.S.C. 154(b) by 0 days.

(21) Appl. No.: 16/117,513

(22) Filed: Aug. 30, 2018

(65) Prior Publication Data
US 2019/0265341 A1 Aug. 29, 2019

(30) Foreign Application Priority Data
Feb. 27, 2018 (JP) .................................. 2018-032674

(51) Int. Cl.
| | |
|---|---|
| *G01S 7/52* | (2006.01) |
| *G01S 7/521* | (2006.01) |
| *B62D 25/02* | (2006.01) |
| *G01S 15/04* | (2006.01) |
| *H03K 17/945* | (2006.01) |
| *B62D 25/20* | (2006.01) |

(52) U.S. Cl.
CPC ............ *G01S 7/521* (2013.01); *B62D 25/025* (2013.01); *G01S 15/04* (2013.01); *B62D 25/2036* (2013.01); *H03K 17/945* (2013.01)

(58) Field of Classification Search
CPC ........ B62D 25/20; B62D 21/11; B62D 21/02; B62D 29/008; B62D 21/00; B62D 25/2036; B62D 25/2018; B62D 21/155
USPC ..... 296/204, 193.07, 37.6, 37.2, 187.09, 29, 296/205, 209, 146.11; 29/897.2, 428, 469
See application file for complete search history.

(56) References Cited

U.S. PATENT DOCUMENTS

| | | | |
|---|---|---|---|
| 6,398,252 B1 | 6/2002 | Ishikawa et al. | |
| 9,446,739 B2* | 9/2016 | Herthan | .............. B60R 25/2054 |
| 9,909,350 B2* | 3/2018 | Rai | .......... G01S 17/88 |

(Continued)

FOREIGN PATENT DOCUMENTS

| | | |
|---|---|---|
| JP | 2005-133529 A | 5/2005 |
| TW | 505612 B | 10/2002 |

OTHER PUBLICATIONS

Material describing display of a bracket at car dealership on Mar. 22, 2018 in Japan (Honda Access).

(Continued)

*Primary Examiner* — D Glenn Dayoan
*Assistant Examiner* — Sunsurraye Westbrook

(57) ABSTRACT

A structure for attaching an ultrasound sensor to a side portion of a vehicle includes a bracket via which the ultrasound sensor is attached to face the ground under the floor of the vehicle and to be inclined at a predetermined angle with respect to the horizontal plane such that water drops adhering to the ultrasound sensor flow downward.

7 Claims, 6 Drawing Sheets

(56) References Cited

U.S. PATENT DOCUMENTS

| | | | |
|---|---|---|---|
| 2008/0296926 A1* | 12/2008 | Hanzel | B60R 25/2054 296/146.1 |
| 2008/0296927 A1* | 12/2008 | Gisler | E05F 15/43 296/146.4 |
| 2011/0276234 A1* | 11/2011 | Van Gastel | E05B 81/78 701/49 |
| 2011/0295469 A1* | 12/2011 | Rafii | E05F 15/43 701/49 |
| 2012/0158253 A1* | 6/2012 | Kroemke | B60R 25/2054 701/49 |
| 2014/0039766 A1* | 2/2014 | Miyake | B60R 25/245 701/49 |

OTHER PUBLICATIONS

Material describing display of a bracket at car dealership on Mar. 22, 2018 in Japan (Honda Access Taiwan).

Material describing display of a bracket at car dealership on Mar. 22, 2018 in Japan (Whetron).

Office Action dated Sep. 20, 2019, issued in counterpart TW Application No. 107130621, with English translation (8 pages).

\* cited by examiner

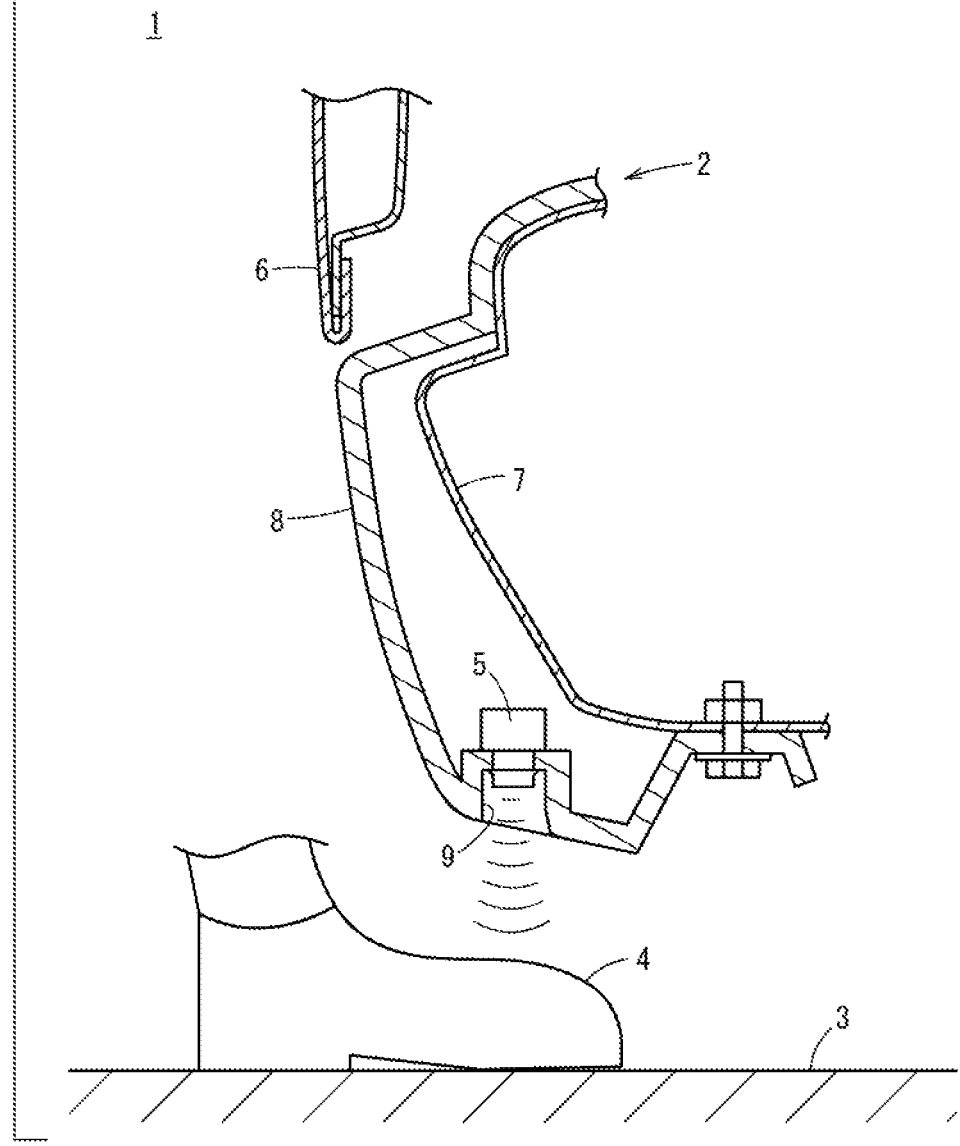

STRUCTURE FOR MOUNTING ULTRASONIC SENSOR

BACKGROUND OF THE INVENTION

Field of the Invention

The present invention relates to a structure for attaching an ultrasound sensor detecting a foot of a user inserted between a vehicle and the ground immediately below the vehicle.

Description of the Related Art

Some vehicle door opening and closing devices are known to open and close vehicle doors based on detection results obtained by kick sensors attached to side portions of the vehicles and comparison results obtained by comparing portable units (electronic keys or portable wireless terminals) carried by passengers or the like of the vehicles.

For example, Japanese Laid-Open Patent Publication No. 2005-133529 discloses a vehicle door opening and closing device 1 illustrated in FIG. 6. The vehicle door opening and closing device 1 includes a kick sensor 5 detecting a foot 4 of a passenger or the like inserted between a vehicle 2 and the ground 3 immediately below the vehicle 2 using radio waves or infrared rays and an in-vehicle wireless terminal (not illustrated) authenticating a portable unit (electronic key or portable wireless terminal) carried by the passenger or the like of the vehicle (ID checking) via wireless communication.

SUMMARY OF THE INVENTION

The vehicle door opening and closing device 1 includes a side sill 7 extending in the longitudinal direction of the vehicle 2 at a lower portion of an opening of a sliding door 6 of the vehicle 2 and a sill cover 8 protecting the side sill 7 disposed on the outer side of the side sill 7 in the vehicle width direction.

The sill cover 8 includes an attaching portion 9 recessed in the bottom surface and facing the ground 3. The kick sensor 5 is attached inside the attaching portion 9. It is suggested that this prevents rainwater, dust, rocks, and the like from directly hitting the kick sensor 5.

However, in the structure for attaching the kick sensor 5 described in Japanese Laid-Open Patent Publication No. 2005-133529, the attaching portion 9 faces the ground 3, and thus rainwater splashing from the ground 3 and spray of water from tires often enter the attaching portion 9. This causes water drops to adhere to the surface of the kick sensor 5. The water drops adhering to the surface of the kick sensor 5 may cause the kick sensor 5 to falsely detect the water drops even when the foot 4 of the passenger or the like of the vehicle does not exist below the vehicle 2. That is, in the structure for attaching the kick sensor 5 described in Japanese Laid-Open Patent Publication No. 2005-133529, the surface of the sensor is not sufficiently drip-proofed.

Moreover, in the structure for attaching the kick sensor 5 described in Japanese Laid-Open Patent Publication No. 2005-133529, the kick sensor 5 is required to be attached to the attaching portion 9 of the sill cover 8 and then attached to the side sill 7 while being integrated with the sill cover 8. Such complicated attachment process requires many hours. In addition, there is still room for improvement in the structure, which is unsuitable as so-called dealer options for attachment at the request of a user at the delivery or after the purchase of a new vehicle.

The present invention has been devised taking into consideration the aforementioned problems, and has the object of providing a structure for attaching an ultrasound sensor allowing the ultrasound sensor to be easily attached to a side portion of a vehicle while preventing water drops from adhering to the surface of the ultrasound sensor.

A structure for attaching an ultrasound sensor to a side portion of a vehicle according to the present invention includes a bracket via which the ultrasound sensor is attached to face a ground under a floor of the vehicle and to be inclined at a predetermined angle with respect to a horizontal plane such that a water drop adhering to the ultrasound sensor flows downward.

According to the present invention, the water drops adhering to the surface of the ultrasound sensor, if any, flow down according to the inclination of the ultrasound sensor. This prevents water drops from adhering to the surface of the ultrasound sensor.

Moreover, the ultrasound sensor is attached to the side portion of the vehicle to face the ground under the floor of the vehicle via the bracket. This enables the ultrasound sensor to be easily attached to the side portion of the vehicle even at the delivery or after the purchase of a new vehicle.

In the present invention, the bracket may include a bottom plate portion to which the ultrasound sensor is attached and an attaching portion extending upward from the bottom plate portion and attached to the vehicle. The bottom plate portion may be inclined at the predetermined angle with respect to the horizontal plane.

According to this structure, the bottom plate portion of the bracket is attached to the vehicle to be inclined at the predetermined angle with respect to the horizontal plane. Thus, simply attaching the ultrasound sensor to the bottom plate portion of the bracket enables the ultrasound sensor to be inclined at the predetermined angle.

In the present invention, the bracket may include a longitudinal plate portion extending upward from an outer end portion of the bottom plate portion in a vehicle width direction and extending in a vehicle length direction of the bottom plate portion.

According to this structure, water, mud, and the like are effectively prevented from entering the inside of the bracket from the outside in the vehicle width direction.

In the present invention, the bottom plate portion may be inclined at the predetermined angle with respect to the horizontal plane such that an outer side in the vehicle width direction is low and an inner side in the vehicle width direction is high, and a gap may be left between the longitudinal plate portion and the attaching portion.

According to this structure, the water entering the inside of the bracket enclosed by the bottom plate portion, the longitudinal plate portion, and the attaching portion can be effectively discharged to the outside of the bracket through the gap.

In the present invention, the longitudinal plate portion may have an opening.

According to this structure, the water entering the inside of the bracket enclosed by the bottom plate portion, the longitudinal plate portion, and the attaching portion can be reliably discharged to the outside of the bracket through the opening.

According to the present invention, the water drops adhering to the surface of the ultrasound sensor, if any, flow down according to the inclination of the ultrasound sensor. This prevents water drops from adhering to the surface of the ultrasound sensor. Moreover, since the ultrasound sensor is attached via the bracket, the ultrasound sensor can be easily attached to the side portion of the vehicle even at the delivery or after the purchase of a new vehicle.

The object, features, and advantages of the present invention will become more apparent from the following detailed description of a preferred embodiment of the present invention which refers to the accompanying drawings.

BRIEF DESCRIPTION OF THE DRAWINGS

FIG. 6 is a partially omitted cross-sectional view illustrating a known structure for attaching an ultrasound sensor.

DESCRIPTION OF THE PREFERRED EMBODIMENTS

Figure 1A:
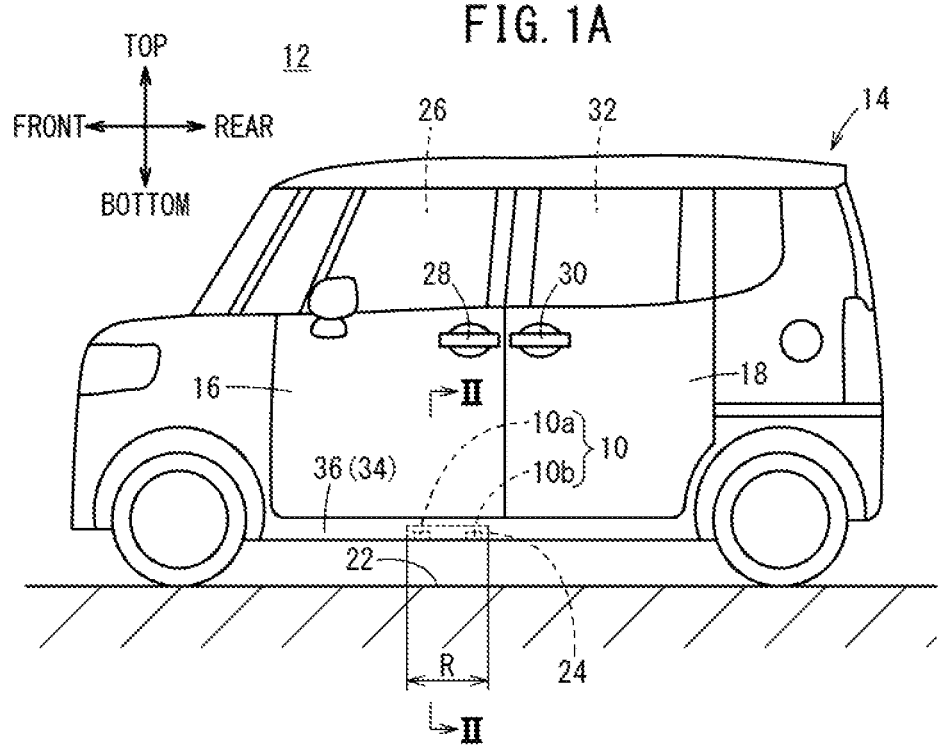
FIG. 1A is a schematic side view of a vehicle, to which a structure for attaching an ultrasound sensor according to an embodiment is applied, while a sliding door is closed.

A preferred embodiment of a structure for attaching an ultrasound sensor according to the present invention will now be described in detail below with reference to the accompanying drawings.

In the drawings described below, the front, rear, left, right, top, and bottom illustrated by arrows refer to directions relative to an occupant (seated person) sitting in a vehicle seat (not illustrated) inside a vehicle 14.

Figure 1B:
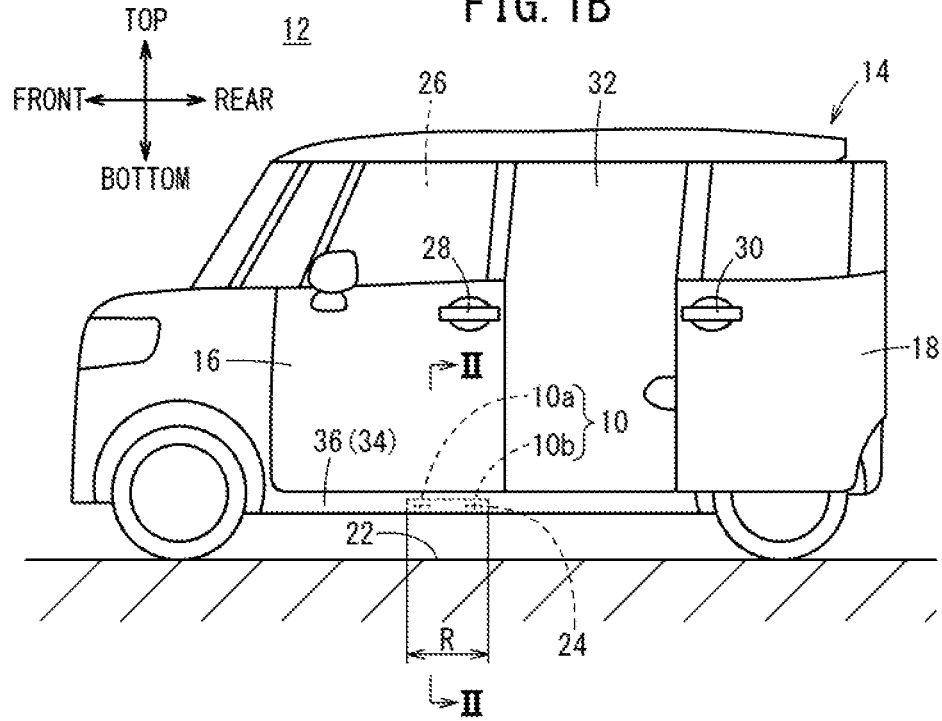
FIG. 1B is a schematic side view of the vehicle while the sliding door is open.

As illustrated in FIGS. 1A and 1B, the vehicle 14 to which an attachment structure 12 for attaching an ultrasound sensor 10 according to this embodiment is applied includes a front door (hinged door) 16 adjacent to a passenger seat (front seat) and a sliding door 18 adjacent to a rear seat. The ultrasound sensor 10 is attached to a side portion of the vehicle 14 via a bracket 24 to face the ground 22 immediately below the vehicle 14.

The front door 16 of the vehicle 14 is a hinged door a passenger or the like uses to manually open and close a front left opening 26 of the vehicle 14 by gripping an outer door handle 28 of the front door 16.

On the other hand, the sliding door 18 of the vehicle 14 is a sliding door a passenger or the like uses to electrically open a rear left opening 32 of the vehicle 14 by pulling an outer door handle 30 of the sliding door 18.

Specifically, the sliding door 18 is a so-called power sliding door automatically opened under the condition that the sliding door 18 is closed and unlocked, when a passenger or the like pulls the outer door handle 30 of the sliding door 18 or presses an open/close button of a portable unit (electronic key or portable wireless terminal; not illustrated) constituting an entry system of a smart key type.

Moreover, the sliding door 18 according to this embodiment is opened and closed in a case where the ultrasound sensor 10 detects a foot of a passenger or the like kicked in and out (kicking motion) between the vehicle 14 and the ground 22 immediately below the vehicle 14, while at the same time the identification (ID) of the portable unit (not illustrated) carried by the passenger or the like is verified.

The ultrasound sensor 10 includes a pair of ultrasonic transducers 10a and 10b having identical specifications, and each of the transducers is electrically wired to a device for opening and closing the sliding door (not illustrated) inside the vehicle 14.

The ultrasonic transducers 10a and 10b are of dual-purpose type, and transmission and reception of ultrasound by the transducers are alternately switched in a predetermined cycle (for example, of several hundred milliseconds). These transducers have an advantage of longer service life compared with a case where the transducers are used only for transmission or reception. In FIG. 1, reference sign R denotes a detectable range (detectable area) of the ultrasound sensor 10.

Next, the attachment structure 12 for attaching the ultrasound sensor 10 to the vehicle 14 will be described with reference to FIGS. 2 to 4.

Figure 2:
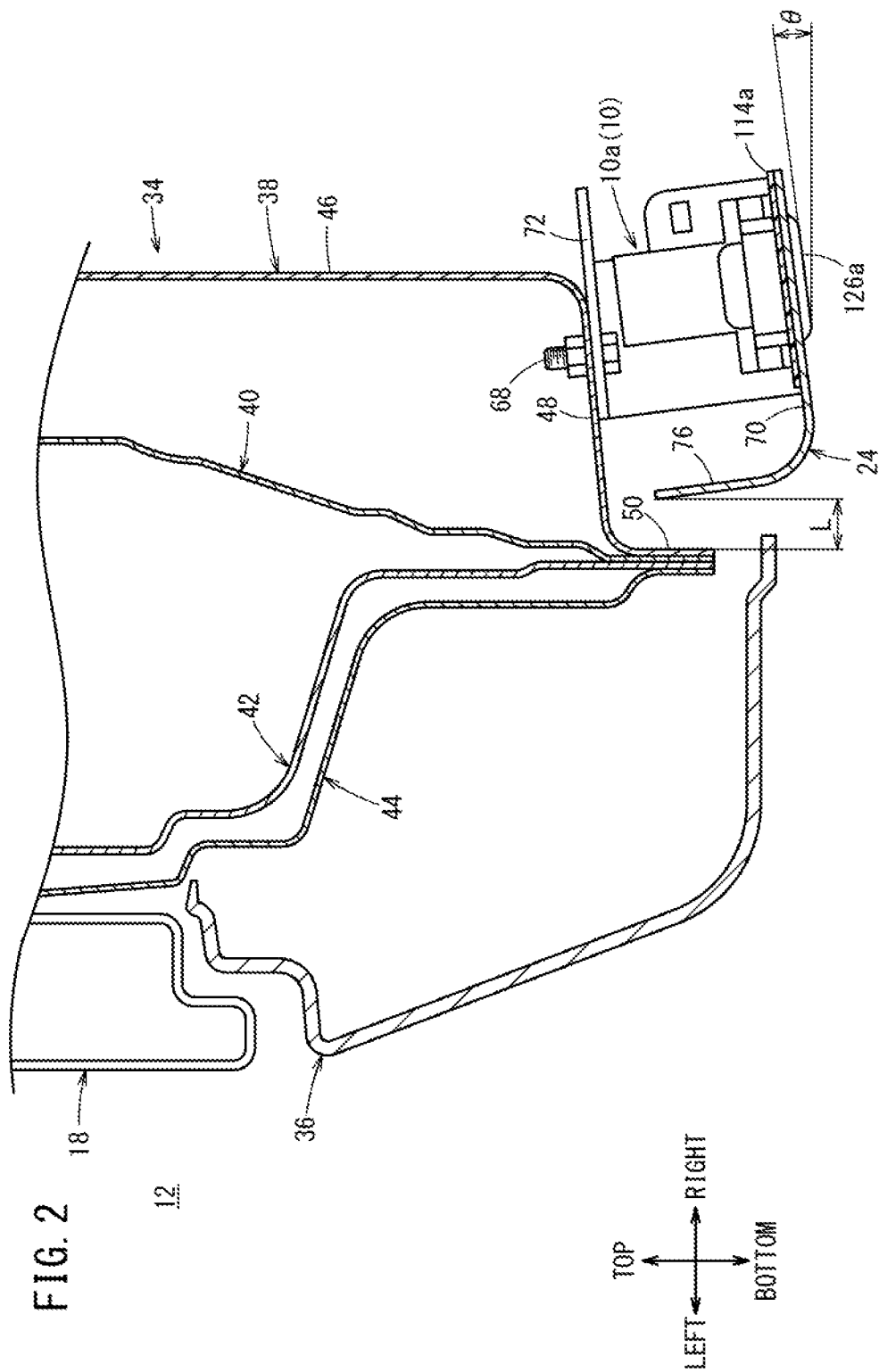
FIG. 2 is a partially omitted cross-sectional view taken along line II-II illustrated in FIGS. 1A and 1B.

As illustrated in FIG. 2, a side sill 34 is disposed below an end portion of the vehicle 14 in the transverse direction (width direction) of the vehicle 14 and extends in the longitudinal direction (length direction) of the vehicle 14. A side sill cover 36 is disposed on the outer side of the side sill 34 in the transverse direction, and the bracket 24 is attached under the side sill 34. The ultrasound sensor 10 is attached to the side sill 34 via the bracket 24.

The side sill 34 has a closed-sectional structure including a plurality of joined steel sheets. The side sill 34 includes a side sill inner 38 joined to the bottom surface of a floor panel (not illustrated), side sill stiffeners 40, 42 disposed on the outer side of the side sill inner 38 in the transverse direction (width direction), and a side sill outer 44 disposed on the outer side of the side sill stiffeners 40, 42 in the transverse direction.

The side sill inner 38 includes an upper plate portion 46 joined to the bottom surface of the floor panel (not illustrated) and extending downward, a lower plate portion 48 bent horizontally from the lower end edge portion of the upper plate portion 46 and inclined downward and outward in the transverse direction, and a lower flange portion 50 bent from the end edge portion of the lower plate portion 48 on the outer side in the transverse direction and protruding downward.

Figure 3:
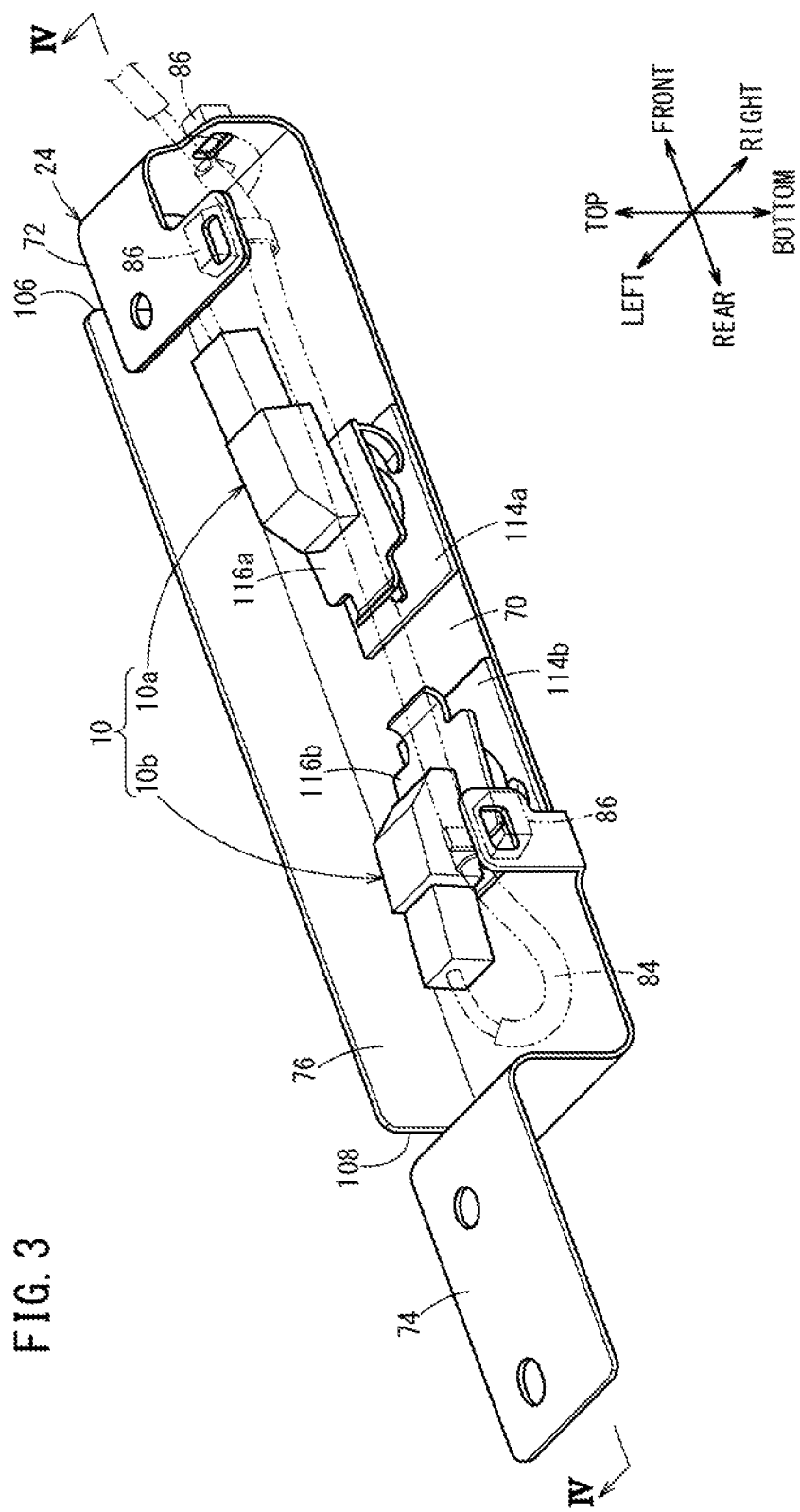
FIG. 3 is a perspective view of an ultrasound sensor and a bracket.

As illustrated in FIG. 3, the bracket 24 includes a bottom plate portion 70 to which the ultrasound sensor 10 is attached, a first attaching portion 72 extending upward from the front end portion of the bottom plate portion 70 in the longitudinal direction and connected to the lower plate portion 48 of the side sill inner 38 via a bolt 68 (see FIG. 2), a second attaching portion 74 extending upward from the rear end portion of the bottom plate portion 70 in the longitudinal direction and connected to the lower plate portion 48 of the side sill inner 38 via other bolts 68, and a longitudinal plate portion 76 extending upward from the outer end portion of the bottom plate portion 70 in the transverse direction (width direction) and extending in the longitudinal direction of the bottom plate portion 70. In FIG. 3, reference sign 84 denotes a wiring cord for electrically connecting the ultrasound sensor 10 and the device for opening and closing the sliding door (not illustrated) inside the vehicle 14, and reference sign 86 denotes a fastener (tie) for securing the wiring cord 84 to the bracket 24.

The bottom plate portion 70 has a substantially rectangular shape and has through-holes 78a, 78b (see FIG. 4) in the vicinity of the middle of the bottom plate portion 70. The ultrasonic transducers 10a and 10b of the ultrasound sensor 10 are respectively fitted in the through-holes 78a, 78b via sealing members 114a, 114b.

In this embodiment, the ultrasonic transducers 10a and 10b are respectively fitted in the through-holes 78a, 78b using clips 116a, 116b. However, the embodiment is not limited to this, and various known securing members may be applicable.

The sealing members 114a, 114b are resin plates having a substantially rectangular shape and respectively seal minute gaps between the ultrasonic transducer 10a and the through-hole 78a and between the ultrasonic transducer 10b and the through-hole 78b.

The longitudinal plate portion 76 has a substantially rectangular, plate-shape extending upward from the outer end portion of the bottom plate portion 70 in the transverse direction (width direction) and extending in the longitudinal direction (length direction) of the bottom plate portion 70. The longitudinal plate portion 76 functions as a vertical wall blocking rainwater and the like running toward the bracket 24 from the outside in the transverse direction (width direction).

Figure 4:
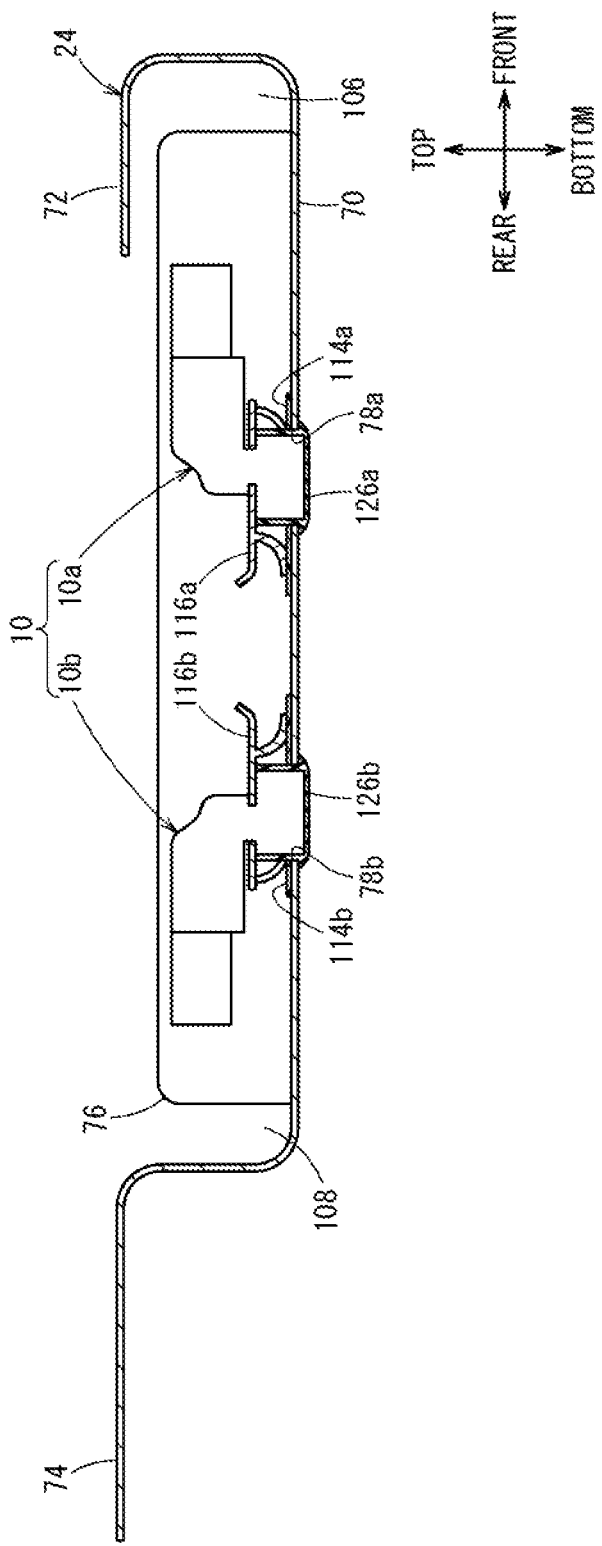
FIG. 4 is a longitudinal sectional view taken along line IV-IV illustrated in FIG. 3.

As illustrated in FIG. 4, gaps 106, 108 are respectively left between longitudinal plate portion 76 and the first attaching portion 72 and between the longitudinal plate portion 76 and the second attaching portion 74. The gaps 106, 108 function as outlets for discharging rainwater and the like to the outside of the bracket 24 in a case where the rainwater enters the upper side of the bottom plate portion 70, more specifically, the vicinity of the ultrasonic transducers 10a and 10b.

As illustrated in FIG. 2, the bracket 24 is attached under the side sill 34 to be inclined at a predetermined angle $\theta$ with respect to the horizontal plane (ground) to allow the water drops adhering to a surface portion 126a of the ultrasonic transducer 10a and a surface portion 126b of the ultrasonic transducer 10b to flow downward.

More specifically, the bracket 24 is attached under the lower plate portion 48 of the side sill inner 38 to be inclined at the predetermined angle $\theta$ such that the surface portions 126a, 126b from the ground is positioned lowest on the outer side in the transverse direction (width direction) and highest on the inner side in the transverse direction (width direction).

In this embodiment, the ultrasonic transducers 10a and 10b are attached to the bottom plate portion 70 such that the surface portions 126a, 126b are parallel to the bottom plate portion 70. Thus, attaching the bracket 24 under the side sill 34 at the predetermined angle $\theta$ such that the height of the bottom plate portion 70 from the ground is low on the outer side in the width direction and high on the inner side in the width direction causes the surface portions 126a, 126b to be inclined at the predetermined angle $\theta$.

The predetermined angle $\theta$ here is set in a range from 30 to 12° with respect to the horizontal plane with a central value of, for example, 7°.

Moreover, as illustrated in FIG. 2, the bracket 24 is attached to the lower plate portion 48 of the side sill inner 38 such that the longitudinal plate portion 76 is separate from the lower flange portion 50 of the side sill inner 38 by a predetermined distance L.

As described above, the structure 12 for attaching the ultrasound sensor 10 according to the embodiment of the present invention is the structure 12 for attaching the ultrasound sensor 10 to the side portion of the vehicle 14, and the ultrasound sensor 10 is attached via the bracket 24 to face the ground 22 under the floor of the vehicle 14. The ultrasound sensor 10 is attached to be inclined at the predetermined angle $\theta$ with respect to the horizontal plane (ground) such that water drops adhering to the ultrasound sensor 10 flow downward.

According to the above-described structure, the water drops adhering to the surface of the ultrasound sensor 10, if any, flow down according to the inclination of the ultrasound sensor 10. This prevents water drops from adhering to the surface of the ultrasound sensor 10.

Moreover, the ultrasound sensor 10 is attached to the side portion of the vehicle 14 so as to face the ground 22 under the floor of the vehicle 14 via the bracket 24. This enables the ultrasound sensor 10 to be easily attached to the side portion of the vehicle 14 even at the delivery or after the purchase of a new vehicle.

Moreover, the bracket 24 includes the bottom plate portion 70 to which the ultrasound sensor 10 is attached and the first attaching portion 72 and the second attaching portion 74 extending upward from the bottom plate portion 70 and attached to the vehicle 14. The bottom plate portion 70 is inclined at the predetermined angle $\theta$ with respect to the horizontal plane (ground).

According to this structure, the bottom plate portion 70 of the bracket 24 is attached to the vehicle 14 so as to be inclined at the predetermined angle $\theta$ with respect to the horizontal plane. Thus, simply attaching the ultrasound sensor 10 to the bottom plate portion 70 of the bracket 24 enables the ultrasound sensor 10 to be inclined at the predetermined angle $\theta$.

Furthermore, the bracket 24 includes the longitudinal plate portion 76 extending upward from the outer end portion of the bottom plate portion 70 in the width direction and extending in the length direction of the bottom plate portion 70.

According to this structure, water, mud, and the like are effectively prevented from entering the inside of the bracket 24 from the outside in the width direction.

Moreover, the bottom plate portion 70 is inclined at the predetermined angle $\theta$ with respect to the horizontal plane such that the outer side in the width direction is positioned lower than the inner side in the width direction and the gaps 106, 108 are respectively left between the longitudinal plate portion 76 and the first attaching portion 72 and between the longitudinal plate portion 76 and the second attaching portion 74.

According to this structure, the water entering the inside of the bracket 24 enclosed by the bottom plate portion 70, the longitudinal plate portion 76, the first attaching portion 72, and the second attaching portion 74 can be effectively discharged to the outside of the bracket 24 through the gaps 106, 108.

Moreover, the ultrasonic transducers 10a and 10b of the ultrasound sensor 10 are respectively fitted in the through-holes 78a, 78b of the bottom plate portion 70 via the sealing members 114a, 114b.

According to this structure, even when rainwater and the like enter the upper side of the bottom plate portion 70, the rainwater and the like do not pass through the through-holes 78a, 78b and do not leak into the lower side of the bottom plate portion 70, more specifically, into the surface portion 126a of the ultrasonic transducer 10a and the surface portion 126b of the ultrasonic transducer 10b facing the ground 22. Consequently, water drops are prevented from adhering to the surface portions 126a, 126b of the ultrasound sensor 10.

Furthermore, the bracket 24 is attached to the lower plate portion 48 of the side sill inner 38 such that the longitudinal plate portion 76 is separate from the lower flange portion 50 of the side sill inner 38 by the predetermined distance L.

According to this structure, in a case where rainwater and the like run down the upper plate portion 46 to the lower plate portion 48 of the side sill inner 38 and drop from the lower plate portion 48, the amount of water drops entering the inner side of the bracket 24 in the transverse direction, more specifically, the upper side of the bottom plate portion 70 can be reduced compared with a case where the longitudinal plate portion 76 is in contact with or close to the lower flange portion 50.

Figure 5:
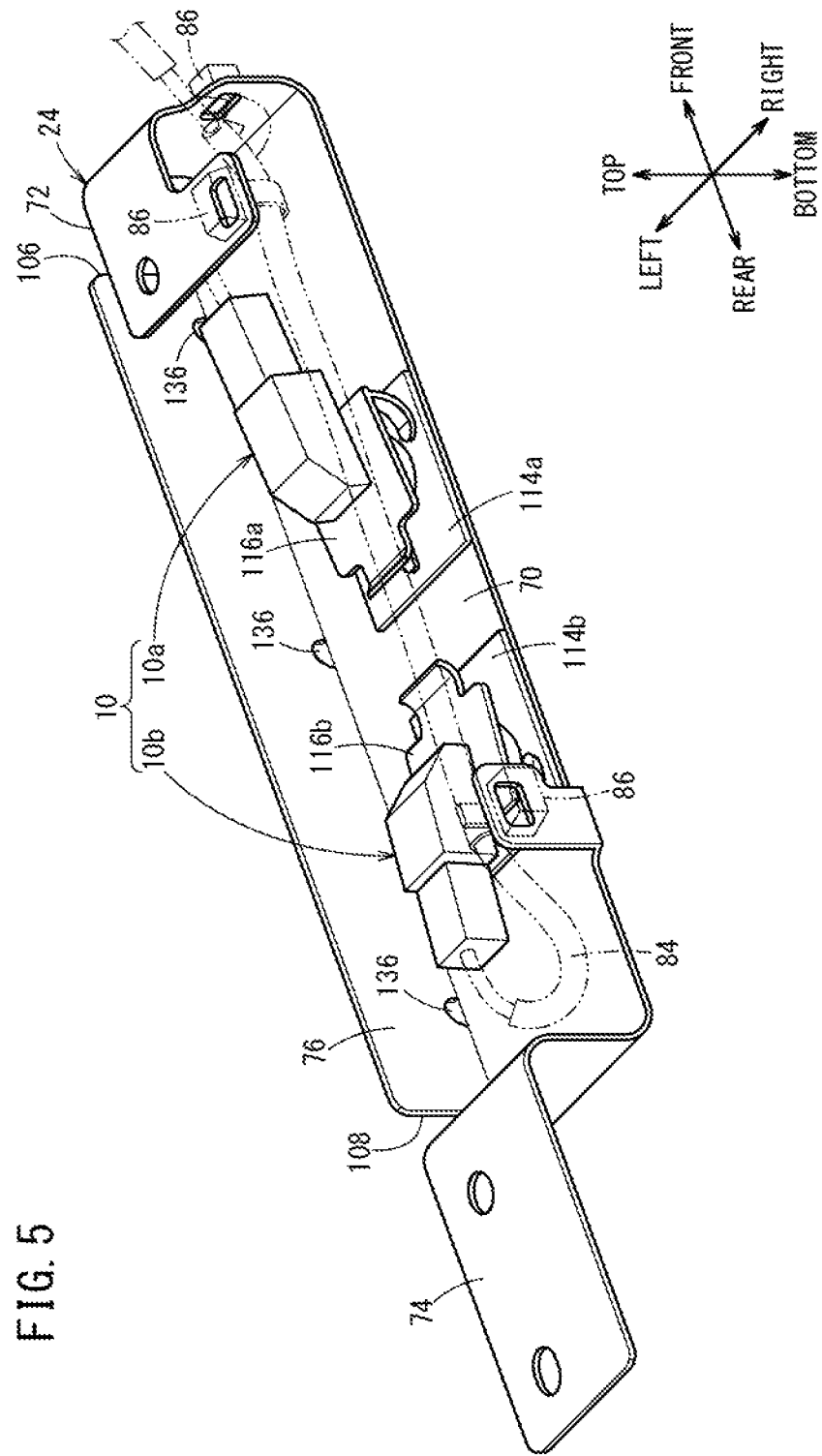
FIG. 5 is a perspective view illustrating a modification of the bracket.

Moreover, as in a modification illustrated in FIG. 5, the longitudinal plate portion 76 may have one or more openings such as drain holes 136 or cutout portions.

This structure enables the water entering the inside of the bracket 24 to be discharged to the outside of the bracket 24 through the openings such as the drain holes 136 bored in the longitudinal plate portion 76 and thus provides effects similar to those produced by the above-described embodiment.

For purpose of brevity and ease of understanding, an example of the structure 12 for attaching the ultrasound sensor 10 to the side portion of the vehicle 14 has been described using the front door 16 and the sliding door 18 of the vehicle 14 adjacent to the passenger seat. However, a structure for attaching an ultrasound sensor to a side portion adjacent to the driver's seat is also similar to the structure adjacent to the passenger seat and is included in the present invention. A structure for attaching an ultrasound sensor to a lower side of the back door of the vehicle 14 is also included in the present invention.

Furthermore, in the above-described embodiment, the ultrasound sensor 10 is attached under the front door 16 at a position close to the sliding door 18. However, the ultrasound sensor 10 may be attached under the sliding door 18.

Moreover, in the above-described embodiment, the ultrasound sensor 10 is attached to the bottom plate portion 70 such that the surface portions 126a, 126b of the ultrasonic transducers 10a and 10b, respectively, are parallel to the bottom plate portion 70. However, the attachment angles of the ultrasound sensor 10 and the bracket 24 are not limited to this. In a case where the surface portion 126a and the surface portion 126b are inclined with respect to the bottom plate portion 70, the method of attaching the bracket 24 to the side sill 34 may be adjusted to incline the surface portions 126a, 126b at the predetermined angle θ.

The ultrasound sensor 10 and the bracket 24 according to this embodiment are commercially available, and are not attached on the factory production line of the vehicle 14 but are attached by dealers or the like as retrofittable options (post-installed options). However, the ultrasound sensor 10 and the bracket 24 may be attached on the factory production line.

The present invention is not limited to the above-described embodiment, and may adopt various structures based on the description of the specification as a matter of course.

What is claimed is:

1. An attachment structure for attaching an ultrasound sensor to a side portion of a vehicle, comprising:
   a bracket via which the ultrasound sensor is attached such that the ultrasound sensor faces a ground under a floor of the vehicle; and
   wherein the ultrasound sensor be inclined at a predetermined angle with respect to a horizontal plane such that a water drop adhering to the ultrasound sensor flows downward, and
   wherein the bracket includes a bottom plate portion and a through-hole formed in the bottom plate portion, and the ultrasound sensor is attached to the through-hole.

2. The attachment structure for attaching the ultrasound sensor according to claim 1, wherein:
   the bracket includes:
   an attaching portion extending upward from the bottom plate portion and attached to the vehicle;
   wherein the bottom plate portion is inclined at the predetermined angle with respect to the horizontal plane.

3. The attachment structure for attaching the ultrasound sensor according to claim 2, wherein the bracket includes a longitudinal plate portion extending upward from an outer end portion of the bottom plate portion in a vehicle width direction and extending in a vehicle length direction of the bottom plate portion.

4. The attachment structure for attaching the ultrasound sensor according to claim 3, wherein:
   the bottom plate portion is inclined at the predetermined angle with respect to the horizontal plane such that an outer side in the vehicle width direction is low and an inner side in the vehicle width direction is high; and
   a gap is left between the longitudinal plate portion and the attaching portion.

5. The attachment structure for attaching the ultrasound sensor according to claim 3, wherein the longitudinal plate portion has an opening.

6. The attachment structure for attaching the ultrasound sensor according to claim 2, wherein the bottom plate portion is inclined at the predetermined angle with respect to the horizontal plane such that an outer side in the vehicle width direction is low and an inner side in the vehicle width direction is high.

7. An attachment structure for attaching an ultrasound sensor to a side portion of a vehicle, comprising:
   a bracket via which the ultrasound sensor is attached such that the ultrasound sensor faces a ground under a floor of the vehicle; and
   wherein the ultrasound sensor be inclined at a predetermined angle with respect to a horizontal plane such that a water drop adhering to the ultrasound sensor flows downward,
   the bracket includes a bottom plate portion to which the ultrasound sensor is attached, and
   the bottom plate portion is inclined at the predetermined angle with respect to the horizontal plane such that an outer side in the vehicle width direction is low and an inner side in the vehicle width direction is high.

* * * * *